(12) United States Patent
Nam et al.

(10) Patent No.: US 9,099,989 B2
(45) Date of Patent: *Aug. 4, 2015

(54) FREQUENCY RECONFIGURABLE DIGITAL FILTER AND EQUALIZER USING THE SAME

(75) Inventors: Sang-Won Nam, Seoul (KR); Kyoung-Jae Kim, Seould (KR); Sung-Il Jung, Seoul (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 356 days.

This patent is subject to a terminal disclaimer.

(21) Appl. No.: 13/580,133

(22) PCT Filed: Feb. 28, 2011

(86) PCT No.: PCT/KR2011/001407
§ 371 (c)(1),
(2), (4) Date: Aug. 20, 2012

(87) PCT Pub. No.: WO2011/105879
PCT Pub. Date: Sep. 1, 2011

(65) Prior Publication Data
US 2012/0314891 A1  Dec. 13, 2012

(30) Foreign Application Priority Data

Feb. 26, 2010 (KR) .................. 10-2010-0018201
Feb. 26, 2010 (KR) .................. 10-2010-0018218
Feb. 26, 2010 (KR) .................. 10-2010-0018219
Jul. 29, 2010 (KR) .................. 10-2010-0073696

(51) Int. Cl.
*G06F 17/10* (2006.01)
*H03H 17/02* (2006.01)

(52) U.S. Cl.
CPC ............................ *H03H 17/0294* (2013.01)

(58) Field of Classification Search
None
See application file for complete search history.

(56) References Cited

U.S. PATENT DOCUMENTS 8,751,553 B2 *  6/2014  Pajaniradja et al. .......... 708/300
8,793,298 B2 *  7/2014  Mathai et al. ................. 708/316
(Continued)

FOREIGN PATENT DOCUMENTS

KR  10-2003-0034263 A   5/2003
KR     10-0722832 B1    5/2007
KR  10-2009-0028755 A   3/2009

OTHER PUBLICATIONS

Kyoung-Jae Kim et al., "Generalized Sampling Kernels for Designing of Sharp FIR Digital Filters with Wide Passband", International Journal of Circuits, System and Signal Processing, vol. 1, No. 2, pp. 166-169, Dec. 2007.
J.Y. Kim et al., "Design of a new DFT filter bank with modified sampling kernels and its application to arbitrary image scaling", IEICE Electronics Express, Jan. 2009.

*Primary Examiner* — David H Malzahn
(74) *Attorney, Agent, or Firm* — TechLaw LLP

(57) ABSTRACT

A frequency reconfigurable digital filter and an equalizer using the same are disclosed. The digital filter includes a sampling kernel storage section configured to store a sampling kernel for performing upsampling of a model filter response scaled by a sampling constant and generating response of Multi images which are repeatedly formed with a constant period; a complementary conversion section configured to generate response of Multi complementary images repeatedly formed with constant period in frequency domain where the Multi images are not generated, the Multi complimentary images having the same characteristic as the Multi images; and an image response operation section configured to operate response of an image corresponding to a selected band among the Multi complementary images and the Multi images. The filter reconfigures frequency to realize various band pass characteristics only through changing very small number of parameter, and a user may change easily band of the filter.

16 Claims, 4 Drawing Sheets

(56) References Cited

U.S. PATENT DOCUMENTS

2002/0184275 A1* 12/2002 Dutta et al. .................. 708/300
2012/0314891 A1* 12/2012 Nam et al. .................... 381/320
2013/0110897 A1* 5/2013 Nam et al. .................... 708/300

* cited by examiner

FREQUENCY RECONFIGURABLE DIGITAL FILTER AND EQUALIZER USING THE SAME

TECHNICAL FIELD

Example embodiment of the present invention relates to a digital filter and an equalizer using the same, more particularly relates to a pass band reconfigurable digital filter and an equalizer using the same.

BACKGROUND ART

A digital filter is integrated, miniaturized and manufactured with low cost and high reliability, and so have much advantage compared with an analog filter. Specially, application field of the digital filter has been increased according as communication velocity is realized with high speed and an amount of communication is augmented, and the digital filter has been employed in devices such as a transmitter and a receiver of a baseband module in a mobile communication system.

The digital filter is generally divided into a finite impulse response filter and an infinite impulse response filter.

The finite impulse response filter uses characteristic that impulse response has a finite length when the impulse response is inputted to the filter. This is because the finite impulse response filter does not use any feedback.

The finite impulse response filter not using the feedback does not need feedback loop, and thus stability of the filter is guaranteed. Specially, since the finite impulse response filter satisfies linear phase characteristic, the finite impulse response filter has been widely used in applications such as waveform transmission, etc. However, in case that the finite impulse response filter will realize approximately the same amplitude as the infinite impulse response filter, order of the finite impulse response filter is more increased. As a result, the finite impulse response filter is more loaded in view of hardware including an adder and a multiplier.

The finite impulse response filter may be designed through a design method in a frequency domain and a design method in a time domain, and a window function method and a frequency sampling method, etc. are mainly used when the finite impulse response filter is designed through the design method in the frequency domain.

The design of the filter in the time domain is simpler than that in the frequency domain because impulse response in the design of the filter in the time domain corresponds to coefficients of the filter. A linear programming is widely known as a method of approximating a transfer function, and an optimal solution may be calculated through finite calculation in case that the optimal solution exists.

Specially, output finitude of the finite impulse response filter allows to omit a calculation process of not generating decimated output or a calculation process of generating a predictable value in an interpolated output, and thus this is calculatedly efficient when performing interpolation or decimation so as to increase or reduce multirate application, e.g. sampling rate of a signal.

Since a number of taps and coefficients, etc. of the finite impulse response filter are fixed, it is difficult to reconfigurable pass band characteristic in case that the finite impulse response filter is designed to realize certain pass band.

FIG. 7 is a view illustrating example of a conventional filter for reconfiguring frequency through coefficient change of a filter.

Referring to FIG. 7, the conventional frequency reconfigurable filter includes a coefficient storage section 100, a multiplexer 102, a multiplier 104 and an adder 106. The coefficient storage section 100 stores coefficient information for plural pass bands.

Coefficient information is extracted in accordance with a user's band selection and the extracted coefficient information is provided to the multiplexer 102 to generate impulse response corresponding to a selected band. The generated impulse response is applied to inputted function x(n), and so an output signal y(n) is generated by filtering the inputted function x(n).

The conventional reconfiguration method has limitation of a reconfigurable band. Only coefficient of the filter is changed though the frequency is reconfigured, and thus it is difficult to reconfigure properly the frequency.

It is impossible to reconfigure frequency in frequency band except frequency corresponding to pre-stored coefficients of the filter. Accordingly, the coefficients of the filter need to be stored one by one so as to reconfigure the frequency, and thus the filter should have a memory for storing much information.

Recently, an equalizer has been generally used in a hearing aid and playing of voice source, etc., reconfiguration of a pass band in accordance with the user's favor is one of important functions of the equalizer, and the frequency reconfiguration of the filter is essentially required for provision of an improved equalizer.

DISCLOSURE OF INVENTION

Technical Problem

The present invention provides a frequency reconfigurable digital filter to realize various band pass characteristics only through changing very small number of parameter and an equalizer using the same.

In addition, the present invention provides a digital filter which can change pass band freely about various pass band and an equalizer using the same.

Furthermore, the present invention provides a digital filter which can change pass band through combination of plural images so that a user may change easily the pass band of the filter.

Moreover, the present invention provides a frequency reconfigurable digital filter for changing pass band characteristics through simple method of changing a parameter using a closed-form response in a time domain.

Other aspects of the present invention will be thought easily by those skilled in the art through following embodiments.

Solution to Problem

In one aspect, the present invention provides a frequency reconfigurable digital filter comprising: performing upsampling of a model filter response scaled by a sampling constant and generating response of Multi images which are repeatedly formed with a constant period; a complementary conversion section configured to generate response of Multi complementary images repeatedly formed with constant period in frequency domain where the Multi images are not generated, the Multi complimentary images having the same characteristic as the Multi images; and an image response operation section configured to operate response of an image corresponding to a selected band among the Multi complementary images and the Multi images.

The frequency reconfigurable digital filter further includes a filter response operation section configured to generate the response of the filter by summing the responses of each image corresponding to the selected band in case that the selected band corresponds to plural Multi images or Multi complementary images The sampling kernel includes the sampling constant and Multi image number as variable.

The sampling kernel $K_{\alpha,L}(n,k)$ is expressed as following Equation, $$K_{\alpha,L}(n,k) = (2L+1)\mathrm{sinc}\left(\frac{n}{\alpha} - k\right)(2L+1),$$

here L is the Multi image number, and $\alpha$ is the sampling constant.

The upsampling of model filter response and generation of Multi images using the sampling kernel is performed by the following equation.

$$h_{(\alpha),L}[n] = \frac{1}{2\pi}\sum_{k=0}^{N-1} h[k] \int_{-\frac{(2L+1)\pi}{\alpha}}^{\frac{(2L+1)\pi}{\alpha}} e^{j(n-\alpha k)\omega'} d\omega' = \sum_{k=0}^{N-1} h[k] \cdot \frac{1}{\alpha} K_{\alpha,L}(n,k),$$

here $\alpha$ is the sampling constant, h[n] is the response of the model filter, L is the Multi image number, $K_{\alpha,L}(n,k)$ is the sampling kernel, and the Multi image number corresponds to the L.

The complementary conversion section generates plural Multi complementary images by delaying the response for generating the Multi images by $$z^{-\frac{(N-1)}{2}}$$

in z domain, and N is length of the model filter.

The image response operation section operates the response of the image by subtracting response for generating (L-1) Multi images or Multi complementary images from response for generating L Multi images or Multi complementary images so as to operate the response of a selected Lth Multi image or Multi complementary image.

In another aspect, the present invention provides a frequency reconfigurable digital filter comprising: a Multi image response operation section configured to operate response of a selected Multi image from a conversion response to convert a model filter response to generate Multi images which are repeatedly generated with a constant period in frequency domain; and a Multi complementary image response operation section configured to operate response of a selected Multi complementary image from a conversion response to convert a model filter response to generate Multi complimentary images which are repeatedly generated with a constant period in frequency domain where the Multi images are not generated.

The frequency reconfigurable digital filter further includes a filter response operation section configured to generate the response of the filter by summing responses of each of the Multi image or complementary image corresponding to a selected bands in case that the selected bands correspond to plural Multi images or Multi complementary images.

The response for generating the Multi images is expressed as following Equation, $$h_{(\alpha),L}[n] = \frac{1}{2\pi}\sum_{k=0}^{N-1} h[k] \int_{-\frac{(2L+1)\pi}{\alpha}}^{\frac{2(L+1)\pi}{\alpha}} e^{j(n-\alpha k)\omega'} d\omega' = \sum_{k=0}^{N-1} h[k] \cdot \frac{1}{\alpha} K_{\alpha,L}(n,k),$$

here $\alpha$ is the sampling constant, h[n] is the response of the model filter, L is a Multi image number, $K_{\alpha,L}(n,k)$ is a sampling kernel scaled by a sampling constant, and the Multi image number corresponds to the L.

The response for generating the Multi complementary image is expressed as following Equation, $$h^c_{(\alpha),L}[n] = \frac{1}{2\pi}\sum_{k=0}^{N-1} h^c[k] \int_{-\frac{(2L)\pi}{\alpha}}^{\frac{(2L)\pi}{\alpha}} e^{j(n-\alpha k)\omega'} d\omega' = \sum_{k=0}^{N-1} h^c[k] \cdot \frac{1}{\alpha} K^c_{\alpha,L}(n,k),$$

here $\alpha$ is a sampling constant, h[n] is the response of the model filter, L is a Multi image number, $K_{\alpha,L}(n,k)$ is a complementary sampling kernel scaled by a sampling constant, and the Multi image number corresponds to the L.

The Multi image response operation section operates response of a selected Lth Multi image by subtracting response for generating (L-1) Multi images from response for generating L Multi images.

In still another aspect, the present invention provides a frequency reconfigurable equalizer comprising: a sampling kernel storage section configured to store a sampling kernel for performing upsampling of a model filter response scaled by a sampling constant and generating response of Multi images which are repeatedly formed with a constant period; a complementary conversion section configured to generate response of Multi complementary images repeatedly formed with constant period in frequency domain where the Multi images are not generated, the Multi complimentary images having the same characteristic as the Multi images; and an image response operation section configured to operate response of an image corresponding to a selected band among the Multi complementary images and the Multi images; a gain setting section configured to set gain of the images; and an equalizer section configured to generate final output response by summing the responses of the images to which the set gain is applied.

In still another aspect, the present invention provides a frequency reconfigurable equalizer comprising: a Multi image response operation section configured to operate response of a selected Multi image from a conversion response to convert a model filter response to generate Multi images which are repeatedly generated with a constant period in frequency domain; a Multi complementary image response operation section configured to operate response of a selected Multi complementary image from a conversion response to convert a model filter response to generate Multi complimentary images which are repeatedly generated with a constant period in frequency domain where the Multi images are not generated; a gain setting section configured to set gain of the images of which the responses are operated in the Multi image response operation section or the Multi complementary image response operation section; and an equalizer section configured to generate final output response by summing the response of the images of which the gains are set by the gain setting section.

In still another aspect, the present invention provides a frequency reconfigurable filtering method comprising: operating a response of a Multi images which are formed repeatedly with a constant period in frequency domain, the response of the Multi images being operated by applying a sampling kernel scaled by a sampling constant; operating a response of a Multi complementary images which are formed repeatedly with a constant period in frequency domain where the Multi images are not formed, the Multi complimentary images having same characteristics with the Multi images; and operating response of an image corresponding to a selected band among the Multi complementary images and the Multi images.

In still another aspect, the present invention provides a frequency reconfigurable filtering method comprising: operating response of a selected Multi image from a conversion response to convert a model filter response to generate Multi images which are repeatedly generated with a constant period in frequency domain; and operating response of a selected Multi complementary image from a conversion response to convert a model filter response to generate Multi complimentary images which are repeatedly generated with a constant period in frequency domain where the Multi images are not generated.

In still another aspect, the present invention provides a method of designing a frequency reconfigurable equalizer, the method comprising: operating a response of a Multi images which are formed repeatedly with a constant period in frequency domain, the response of the Multi images being operated by applying a sampling kernel scaled by a sampling constant; operating a response of a Multi complementary images which are formed repeatedly with a constant period in frequency domain where the Multi images are not formed, the Multi complimentary images having same characteristics with the Multi images; and operating response of an image corresponding to a selected band among the Multi complementary images and the Multi images; setting gain of the images of which responses are operated; and operating final output response by summing the response of the images to which the gain is set.

In still another aspect, the present invention provides a method of designing a frequency reconfigurable equalizer, the method comprising: operating response of a selected multi image from a conversion response to convert a model filter response to generate Multi images which are repeatedly generated with a constant period in frequency domain; and operating response of a selected Multi complementary image from a conversion response to convert a model filter response to generate Multi complimentary images which are repeatedly generated with a constant period in frequency domain where the Multi images are not generated; setting gain of the images of which the responses are operated; and operating final output response by summing the response of the images to which the gain is set.

Advantageous Effects of Invention

In one embodiment of the present invention, frequency may be reconfigured to realize various pass band characteristics only through change of very small number of parameter.

In addition, the present invention may reconfigure freely frequency about various bands, and a user may change easily the band of the filter.

Furthermore, the present invention may change band pass characteristics through a simple method of changing a parameter using a closed-form response expression in a time domain at specific band.

BRIEF DESCRIPTION OF DRAWINGS

Example embodiments of the present invention will become more apparent by describing in detail example embodiments of the present invention with reference to the accompanying drawings, in which.

MODE FOR THE INVENTION

Figure 1:
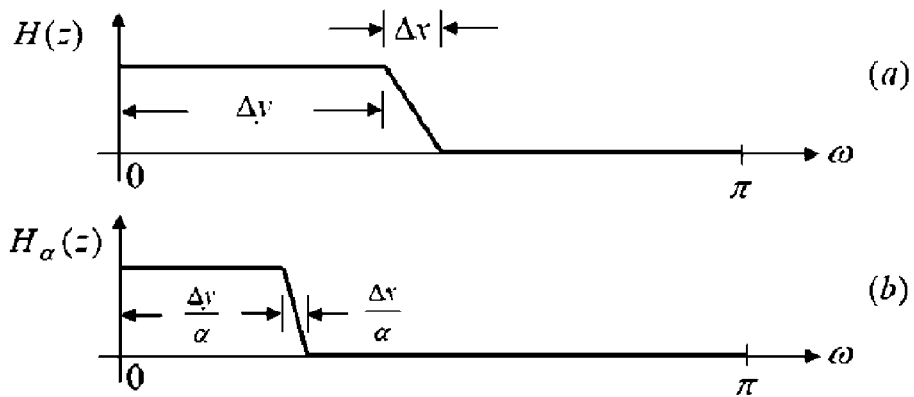
FIG. 1 is a view illustrating change of response of a model filter when the upsampling is performed according to one example embodiment of the present invention.

Hereinafter, embodiments of the present invention will be described in detail with reference to accompanying drawings. The same reference numbers will be used to refer to the same or like elements, and repeated description of the same or like elements will be omitted.

Operation Principle of a Filter (1) Upsampling

In the present invention, the upsampling means process for applying sampling kernel to a model filter in order to enhance skirt characteristics of a model filter. The model filter designed to have specific filtering characteristics may be realized with hardware or software. In one embodiment of the present invention, a half-band filter may be used as the model filter, and the half-band filter has proper filtering characteristics to be used in an equalizer.

The upsampling in the present invention is performed for enhancing skirt characteristic corresponding to a slope of a pass band of the filter, and bandwidth may be adjusted through the upsampling. In addition, the upsampling is a preliminary process needed for generating a Multi images and a Multi complementary images.

To design the filter having excellent skirt characteristics (to have high slope in the transition band) is a method of designing ideal filter, but many coefficients should be used for designing the filter so as to enhance the skirt characteristic. This means that many numbers of taps are required for the filter.

As the number of the taps of the filter increases, cost and size of the filter are augmented when the filter is manufactured as a hardware, and much amount of calculation is needed when the filter is designed as a software. The skirt characteristic and the number of the tap are in trade off relation.

The present invention performs the upsampling of the model filter function having comparably small number of the taps to enhance the skirt characteristic, and adjusts the bandwidth of the model filter when needed.

In one embodiment of the present invention, the upsampling is performed by using sampling kernel scaled by sampling constant α.

The sampling kernel is defined as $K_\alpha(n,k)$, and α is defined as the sampling constant. In case that response of the finite impulse response model filter having length N is h[n], the upsampling scaled by the sampling constant of the present invention may be performed as shown in following Equation 1.

$$h_{(\alpha)}[n] = \frac{1}{\alpha} h_\alpha[n] = \sum_{k=0}^{N-1} h[k] \cdot \frac{1}{\alpha} K_\alpha(n, k) \quad [\text{Equation 1}]$$

In the Equation 1, $h_{(\alpha)}[n]$ is the response of the filter having finally good skirt characteristic by the upsampling.

On the other hand, the sampling kernel in the Equation 1 may have various types. The sampling kernel may use Sinc function as one of most ideal cases, but function used in the sampling kernel is not limited to Sinc function. It will be obvious to those skilled in the art that various types of functions are used as the sampling kernel.

For example, the sampling kernel may have various types of adaptive widow functions such as Sinc function shown in following Equation 2, and various functions including Sinc function may be used as the sampling kernel.

$$K_\alpha(n, k) = \mathrm{sinc}\left(\frac{n}{\alpha} - k\right) \quad [\text{Equation 2}]$$

$$K_\alpha(n, k) = \frac{\sin\pi\left(\frac{n}{\alpha} - k\right)}{\pi\left(\frac{n}{\alpha} - k\right)} \frac{\cos\pi R\left(\frac{n}{\alpha} - k\right)}{1 - 4R^2\left(\frac{n}{\alpha} - k\right)}$$

$$K_\alpha(n, k) = \frac{I_0\left\{\beta\sqrt{1 - \left[\left(\frac{n}{\alpha} - k\right)/M\right]^2}\right\}}{I_0(\beta)}$$

$$K_\alpha(n, k) = \frac{\cos\left\{M\cos^{-1}\left[\lambda\cos\left(\frac{\pi}{M}\left(\frac{n}{\alpha} - k\right)\right)\right]\right\}}{\cosh[M\cosh^{-1}(\lambda)]}$$

In the Equation 2, the second Equation uses raised-cosine, and R means roll-off constant and is a reference of determining the bandwidth of the filter. In the Equation 2, the third Equation uses Kaiser, $I_0$ means zeroth order modified Bessel function of the first kind, β indicates real number for determining shape of a window, and M means length of sequence.

The fourth Equation uses Dolph-Chebychev, and λ is a parameter adjustable sidelobe.

FIG. 1 is a view illustrating change of response of a model filter when the upsampling is performed according to one example embodiment of the present invention.

In FIG. 1, (a) shows response of the model filter before performing the upsampling, and (b) illustrates response of the model filter after the upsampling is performed.

Referring to FIG. 1, transition slope between a pass band and a stop band after the upsampling is performed becomes sharp compared with that of the model filter function before upsampling, and thus the skirt characteristic is enhanced.

In case that the sampling constant α in the Equation 1 is an integer, the Equation 1 may be expressed as convolution type shown in following Equation 3. That is, the upsampling is performed by simple convolution operation, and thus the amount of calculation may be reduced compared with the conventional filter design.

$$h_{(\alpha)}[n] = \frac{1}{\alpha} \sum_{k=0}^{N-1} h[k] \mathrm{sinc}\left(\frac{n}{\alpha} - k\right) \quad [\text{Equation 3}]$$

$$= \frac{1}{\alpha} \sum_{k=0}^{N-1} h[k] \mathrm{sinc}\left[\frac{1}{\alpha}(n - \alpha k)\right]$$

$$= \frac{1}{\alpha} h_{up}[n] * \mathrm{sinc}\left(\frac{n}{\alpha}\right)$$

In the upsampling of the present invention, $h_{(\alpha)}[n]$ is obtained by inserting (α−1) number of 0 between adjacent coefficients of the filter h[n]. Since real operation in the Equation 3 is performed by only coefficient of h[n], sampling rate or amount of calculation is not increased.

Optimal sampling constant α may be calculated so that the filter has optimal amount of calculation. Following Equation 4 is one example of calculating the optimal sampling constant, $\omega_p$ means frequency of the pass band, and $\omega_s$ indicates frequency of the stop band. In case that a is determined as an integer approximate to the sampling constant obtained by the Equation 4, it is most efficient in view of total calculation.

$$\alpha_{opt} = \frac{2\pi}{\omega_p + \omega_s + \sqrt{2\pi(\omega_s - \omega_p)}} \quad [\text{Equation 4}]$$

(2) Multi Image and Multi Complementary Image

The filter of the present invention generates a plurality of images about the response of the filter after the upsampling is performed in order to enable selecting various pass bands. "Image" used in the present invention means an object forming specific pass band in a frequency domain graph of the filter and may also be interpreted as "specific pass band".

Response of the model filter has generally filtering response of baseband, and thus the response of the model filter after the upsampling has only one image in low frequency band.

The present invention converts the response of the upsampled model filter to have plural images. This means that the response of the filter has plural pass bands through the conversion. In the present invention, image generated by converting upsampled model filter response is referred to as "Multi image".

The Multi images are generated on the basis of the image of the baseband, and the Multi images (pass bands) have the same characteristic as the image of the baseband. In other words, in case that bandwidth, attenuation characteristic and size of the image of a low pass band are respectively W, C and A, the Multi images may have also bandwidth W, attenuation characteristic C and size A. That is, shape of the first Multi image is same as that of second Multi image and third Multi image.

The Multi images generated based on the image of the base band may have constant period. Here, the period is associated with bandwidth of the image of the base band.

For example, in case that the image of the base band has the bandwidth 2W between −W and W, the Multi images are repeatedly formed with period of 2W and type of each Multi image is same as the image of the base band.

Accordingly, in case that the image of the base band having the bandwidth 2W between −W and W exists, the Multi images are generated through a method of generating a second Multi image in a band between 3W and 5W and generating a third Multi image in a band between 7W and 9W.

Figure 2:
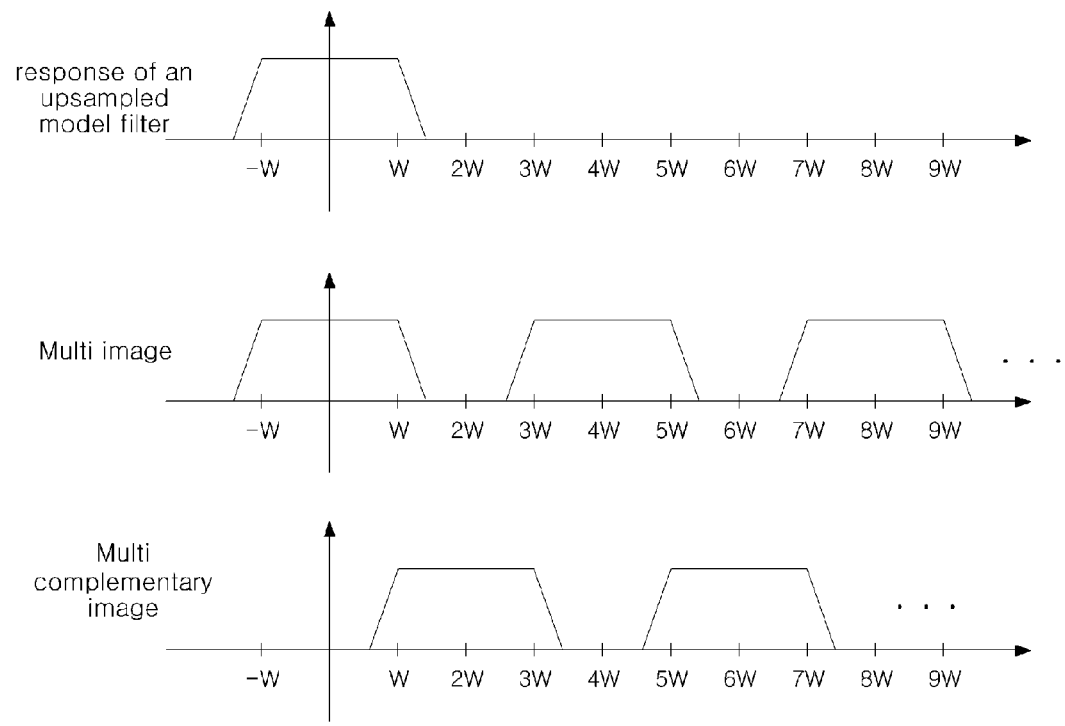
FIG. 2 is a view illustrating Multi image and Multi complementary image according to one example embodiment of the present invention.

FIG. 2 is a view illustrating Multi images and Multi complementary images according to one example embodiment of the present invention.

In FIG. 2, (a) shows the response of the Equation 3 in the frequency domain, and (b) illustrates the Multi image of the response (a). As shown in FIG. 2, the same images are repeatedly formed with constant period.

The Multi images of the base band response of the model filter after the upsampling may be generated through IDTFT conversion, and IDTFT conversion for the response of the model filter can be expressed as following Equation 5.

$$h_{(\alpha)}[n] = \frac{1}{2\pi} \sum_{k=0}^{N-1} h[k] \int_{-\frac{\pi}{\alpha}}^{\frac{\pi}{\alpha}} e^{j(n-\alpha k)\omega'} d\omega' \quad \text{[Equation 5]}$$

In the Equation 5, response of model filter h[n] having one image is converted to have Multi images. In case that L is the number of the image (image number), response $h_{(\alpha),L}[n]$ of the filter having plural Multi images generated through the IDTFT conversion may be expressed as following Equation 6.

$$h_{(\alpha),L}[n] = \frac{1}{2\pi} \sum_{k=0}^{N-1} h[k] \int_{-\frac{(2L+1)\pi}{\alpha}}^{\frac{(2L+1)\pi}{\alpha}} e^{j(n-\alpha k)\omega'} d\omega' \quad \text{[Equation 6]}$$

$$= \sum_{k=0}^{N-1} h[k] \cdot \frac{1}{\alpha} K_{\alpha,L}(n, k)$$

In the Equation 6, in case that Sinc function is applied to the sampling kernel, $K_{\alpha,L}(n,k)$ the sampling kernel may be expressed as following Equation 7.

$$K_{\alpha,L}(n, k) = (2L+1)\text{sinc}\left(\left(\frac{n}{\alpha} - k\right)(2L+1)\right) \quad \text{[Equation 7]}$$

In the Equations 6 and 7, the Multi images are not generated in case that L is 0, and the Multi images corresponding to an integer L are generated in case that the L is not 0.

The Equation 6 may be expressed as frequency response shown in following Equation 8.

$$H_{(\alpha),L}[e^{j\omega}] = \quad \text{[Equation 8]}$$

$$\begin{cases} H[e^{j\alpha\omega}], & \omega \in \left[-\frac{(2L+1)\pi}{\alpha}, \frac{(2L+1)\pi}{\alpha}\right] \\ 0, & \omega \in \left[-\pi, -\frac{\pi(2L+1)}{\alpha}\right) \cup \left[\frac{\pi(2L+1)}{\alpha}, \pi\right) \end{cases}$$

As described above, shape of the Multi images is identical to that of the response of the upsampled model filter, and period of the Multi images corresponds to bandwidth of the response of the upsampled model filter.

It should be noted that the sampling kernel of Equation 1 and Equation 2 for only upsampling is different from the sampling kernel of Equation 6 and Equation 7 when L≠0, and if sampling kernel of Equation 6 and Equation 7 is applied to the model filter, the upsampling and the generation of Multi images are performed simultaneously.

Figure 3:
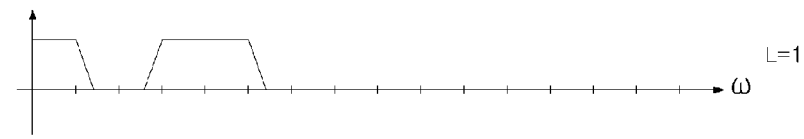
FIG. 3 is a view illustrating change of the Multi image in accordance with change of L according to one example embodiment of the present invention.
Figure 3:
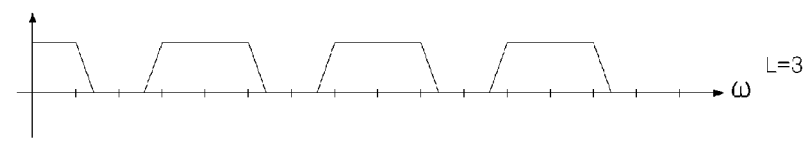

FIG. 3 is a view illustrating change of the Multi image in accordance with change of L according to one example embodiment of the present invention.

Referring to FIG. 3, a number of the generated Multi images may be adjusted by changing the image number L which is a parameter of the sampling kernel.

As shown in FIG. 3, one additional Multi image is generated in case that the L is 1, and three additional Multi images are generated in case that the L is 3. Here, L may be selected by a user.

In one embodiment of the present invention, a plurality of complementary images are generated in frequency domain where Multi images are not formed.

That is, the Multi complementary images are formed between W and 3W and between 5W and 7W where the Multi images are not formed.

The Multi complementary images have also the same characteristics as the base band image of the model filter, and the Multi complementary images are repeatedly formed with period of base band image bandwidth of the model filter.

The Multi complementary image may be obtained by delaying the response of the model filter by $$z^{-\frac{(N-1)}{2}}$$

in z domain, and this may be expressed as following Equation 9. Here, N is a length of the model filter.

$$H^c(z) = z^{-\frac{(N-1)}{2}} - H(z) \quad \text{[Equation 9]}$$

$$H^c_{(\alpha),L}(z) = z^{-\frac{(N-1)\alpha}{2}} - H_{(\alpha),L}(z)$$

Finally, the Multi complementary images may be calculated through following Equation 10, and the number of the Multi complementary images may be also determined by L.

$$h^c_{(\alpha),L}[n] = \frac{1}{2\pi} \sum_{k=0}^{N-1} h^c[k] \int_{-\frac{(2L)\pi}{\alpha}}^{\frac{(2L)\pi}{\alpha}} e^{j(n-\alpha k)\omega'} d\omega' \quad \text{[Equation 10]}$$

$$= \sum_{k=0}^{N-1} h^c[k] \cdot \frac{1}{\alpha} K^c_{\alpha,L}(n, k)$$

In Equation 10, in case that Sinc function is applied to the sampling kernel for the Multi complementary images, the sampling kernel may be expressed as following Equation 11.

$$K^c_{\alpha,L}(n, k) = (2L)\text{sinc}\left(\left(\frac{n}{\alpha} - k\right)(2L)\right) \quad \text{[Equation 11]}$$

The Equation 10 may be expressed as frequency response shown in following Equation 12.

$$H^c_{(\alpha),L}[e^{j\omega}] = \begin{cases} H[e^{j\alpha\omega}], & \omega \in \left[-\frac{(2L)\pi}{\alpha}, \frac{(2L)\pi}{\alpha}\right] \\ 0, & \omega \in \left[-\pi, -\frac{\pi(2L)}{\alpha}\right) \cup \left[\frac{\pi(2L)}{\alpha}, \pi\right) \end{cases} \quad \text{[Equation 12]}$$

The number of the Multi complementary images may also be adjusted by changing the image number L.

Figure 8:
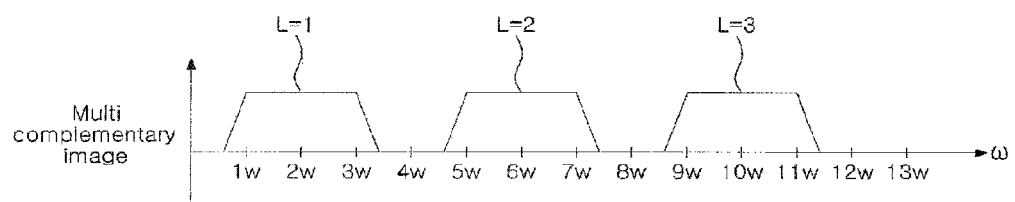
FIG. 8 is a view illustrating change of the Multi complementary image in accordance with change of L according to one example embodiment of the present invention.

FIG. 8 is a view illustrating change of the Multi complementary images in accordance with change of L according to one example embodiment of the present invention.

Referring to FIG. 8, it is verified that the Multi complementary image is not generated in case that the L is 0, and the Multi complementary images are generated by the same number as the L.

(3) Operation of Image Response

When the Multi images and the Multi complementary images are generated through the Equations 6 and 10, a process of operating response of a desired pass band by selecting images corresponding to the desired pass band is performed.

In case that a Multi image or a Multi complementary image corresponding to the desired pass band is selected, response of the selected image is operated.

For example, in case that a band pass filter having band of 7W to 9W is needed, response of the second Multi image is operated because the band is identical to that of the second Multi image in FIG. 3.

Response of selected Nth Multi image may be calculated by subtracting response obtained by substituting (N−1) for L in the Equation 6 from response obtained by substituting N for L in the Equation 6. The response of the filter about the second Multi image in the above example may be calculated by subtracting equation obtained by substituting 1 for L in the Equation 6 from equation obtained by substituting 2 for L in the Equation 6.

Response of the filter corresponding to an Lth image may be expressed as following Equation 13.

$$hb_{(\alpha),L}[n] = h_{(\alpha),L}[n] - h_{(\alpha),L-1}[n] \quad [\text{Equation 13}]$$

The above method of operating the response is applied in the same manner to a process of operating response of specific Multi complementary image.

Response of an Lth Multi complementary image may be calculated by subtracting response obtained by substituting (L−1) in the Equation 10 from response obtained by substituting L in the Equation 10, and may be expressed as following Equation 14.

$$hb^c_{(\alpha),L}[n] = h^c_{(\alpha),L}[n] - h^c_{(\alpha),L-1}[n] \quad [\text{Equation 14}]$$

(4) Final Response of the Filter

The present invention generates final response of the filter by summing the selected Multi image responses or Multi complimentary image. In case that wide-band filter response or Multi-band filter response is necessary, plural Multi images or Multi complementary images are selected, and final filter response is obtained by summing each of the selected image responses or complimentary image responses.

For example, in case that a band pass filter having multi band corresponding to a second Multi image and a third Multi image is required, the final response of the filter may be obtained by summing response of the second Multi image and response of the third Multi image.

Constitution of the Filter (1) First Embodiment

Figure 4:
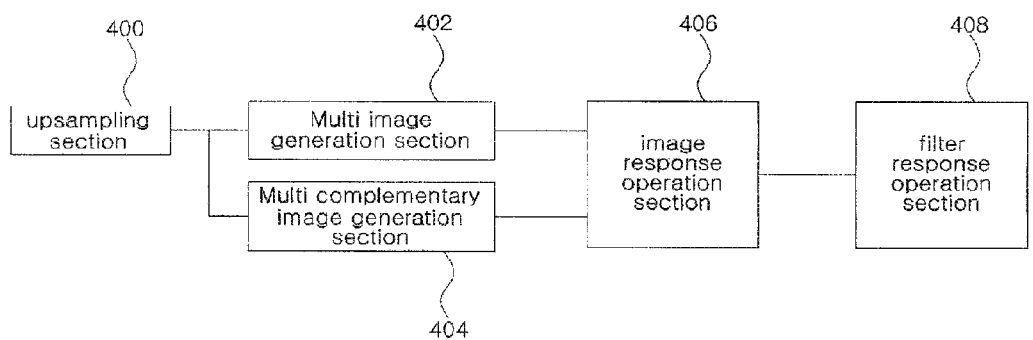
FIG. 4 is a block diagram illustrating a frequency reconfigurable according to a first example embodiment of the present invention.

FIG. 4 is a block diagram illustrating a frequency reconfigurable digital filter according to a first example embodiment of the present invention.

In FIG. 4, the frequency reconfigurable digital filter of the present embodiment includes an upsampling section 400, a Multi image generation section 402, a Multi complementary image generation section 404, an image response operation section 406 and a filter response operation section 408.

The upsampling section 400 applies the sampling kernel scaled by the sampling constant to the model filter, thereby enhancing characteristics of the model filter. The upsampling about the model filter may be performed by multiplying the model filter function by the sampling kernel scaled by the sampling constant a as shown in the Equation 1, and attenuation characteristic and bandwidth of the model filter are changed in accordance with the sampling constant $\alpha$. $\alpha$ may be properly selected in accordance with desired bandwidth and attenuation characteristic.

The Multi image generation section 402 generates the response of the Multi image corresponding to the pass bands on the basis of the response of the upsampled model filter, and the Multi complementary image generation section 404 generates the response of the Multi complementary images in the frequency area where Multi images are not formed.

As described above, the Multi image and the Multi complementary image have the same characteristic as the response of the upsampled model filter, and form pass bands in different frequency area, respectively.

It is described above that the upsampling and the process of generating the Multi image and the Multi complementary image are performed in sequence. However, it will be obvious to those skilled in the art that response for upsampling and generating Multi image or Multi complimentary images can be obtained at one time through the equation 6, equation 9 or equation 10.

The image response operation section 406 operates the response of the seletec Multi image or complementary image. In case that specific pass band is selected, the image response operation section 406 operates the response about each of the selected images.

As described above, the response about the image is calculated by subtracting the response to generate (L−1) Multi images from the response to generate L Multi images. The response of the Multi image and the response of the Multi complementary image are as same as the Equation 13 and the Equation 14, respectively.

The filter response operation section 408 operates the final response of the filter by summing the response of each of the selected images, and thereby close-form response for frequency reconfigured filter can be obtained. In case that only one image is selected, response of the image becomes the final response of the filter, and additional summing process is not required.

(2) Second Embodiment

Figure 5:
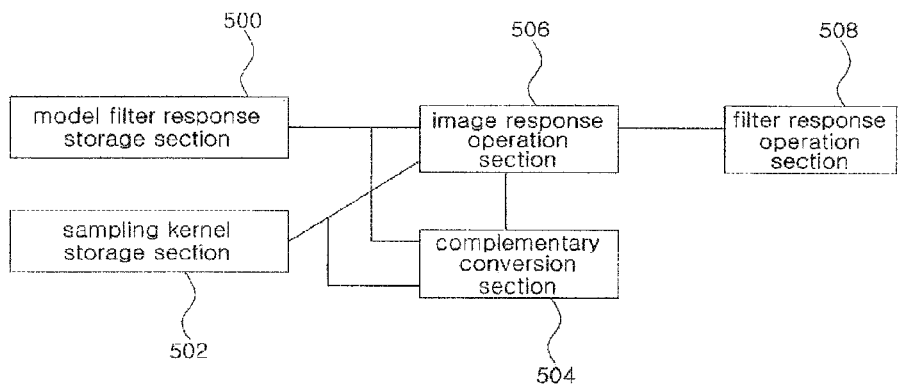
FIG. 5 is a block diagram illustrating a frequency reconfigurable digital filter according to a second embodiment of the present invention.

FIG. 5 is a block diagram illustrating a frequency reconfigurable digital filter according to a second embodiment of the present invention.

The second embodiment shows constitution of the filter as a module in case that the filter is realized with software, and illustrates the filter in the first embodiment as the block diagram in other point of view.

In FIG. 5, the frequency reconfigurable digital filter of the present embodiment includes a model filter response storage section 500, a sampling kernel storage section 502, a complementary conversion section 504, an image response operation section 506 and a filter response operation section 508.

The model filter response storage section 500 stores the response of the model filter having specific number of tap and coefficient.

The sampling kernel storage section 502 stores the sampling kernel scaled by the sampling constant for upsampling and the generation of the Multi images. The sampling kernel has image number L as variable. In case that Sinc function is applied to the sampling kernel, the sampling kernel shown in the Equation 7 is stored in the sampling kernel storage section 502. Various sampling kernels other than Sinc function may be used as shown in the Equation 2.

The complementary conversion section 504 performs complimentary conversion for generation of the Multi complementary images. The complementary conversion may be performed through conversion expression shown in the Equation 9. Alternatively, the response of the model filter and the sampling kernel for the complementary image are stored separately, and the Multi complementary image may be generated by using the response and the sampling kernel.

The image response operation section 506 operates response of the image corresponding to the selected pass band. In case that the Multi image is selected, the image response operation section 506 operates the response corresponding to the selected image through a method shown in the Equations 6 and 13 by using the stored response of the model filter and the sampling kernel which uses sampling constant and the image number as variable.

In case that specific complementary image among the Multi complementary images is selected, the image response operation section 506 operates the response corresponding to the selected Multi complementary image through a method shown in the Equations 10 and 14 by using the stored response of the model filter, the sampling kernel which uses sampling constant and the image number as variable and the complementary conversion.

The filter response operation section 508 operates final response of the filter by summing the response of each of the selected images, and calculates with closed-form shape the response of the filter of which frequency is reconfigured through the above operation. In case that only one image is selected, response of the image becomes the final response of the filter, and extra summing process is not required.

An Equalizer Using the Filter

The equalizer adjustable gains of plural frequency bands and pass band characteristic may be realized by using the above frequency reconfigurable digital filter. The equalizer may be used for adjusting output of audio source in a digital device (for example, a portable phone, an MP3 player, a computer, a laptop, etc.) for playing the audio data, and be also used for manufacturing a hearing aid personalized in accordance with the user's hearing characteristics.

Figure 6:
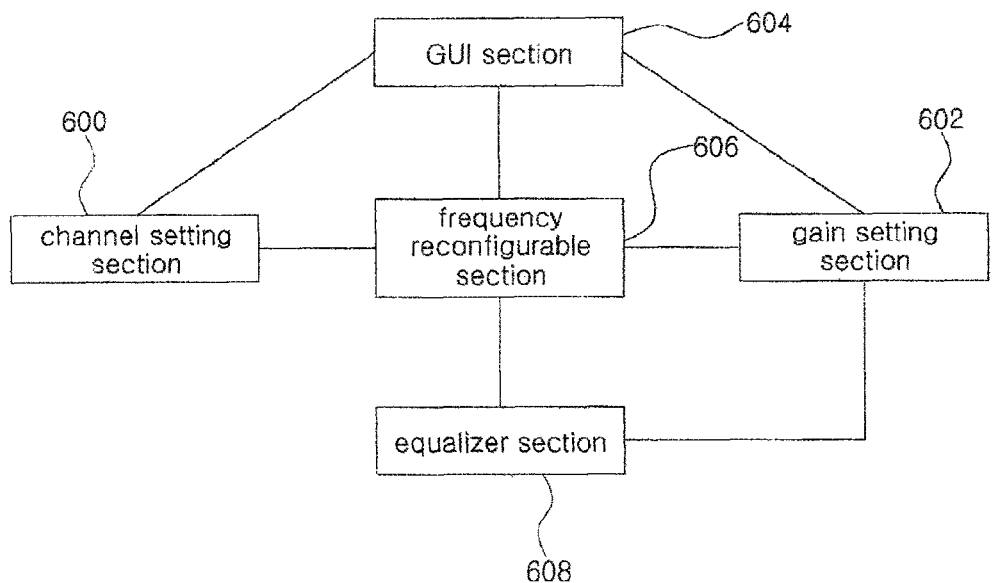
FIG. 6 is a block diagram an equalizer using the frequency reconfigurable filter according to one example embodiment of the present invention.
Figure 7:
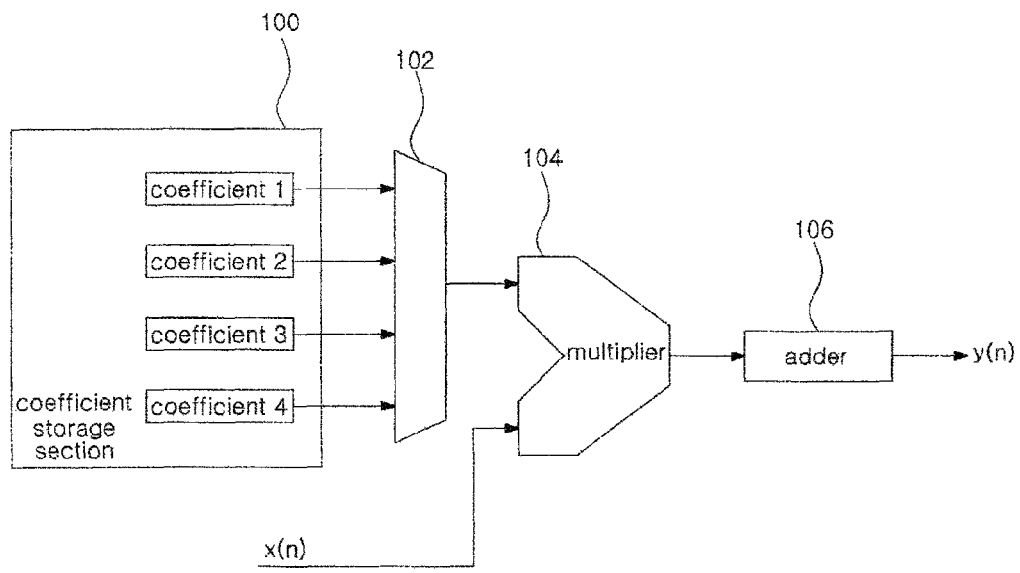
FIG. 7 is a view illustrating example of a conventional filter for reconfiguring frequency through coefficient change of a filter.

FIG. 6 is a block diagram an equalizer using the frequency reconfigurable filter according to one example embodiment of the present invention.

In FIG. 6, the equalizer of the present embodiment includes a channel setting section 600, a gain setting section 602, a GUI section 604, a frequency reconfiguration section 606 and an equalizer section 608.

The GUI section 604 provides an interface through which a user selects a channel of the equalizer. The user may set the channel of the equalizer and gain information of each of the channels through a graphic interface provided from the GUI section 604. A device such as the portable phone having a display may be included in a device having the filter. However, a device such as the hearing aid which does not have a display may realize a GUI using an external device.

The channel setting section 600 sets the channel of the digital filter on the basis of the user's channel setting information. The channel in the equalizer means individual pass band of each of the Multi image or the complementary image in the digital filter of the present invention, and the channel setting section 600 sets the channel on the basis of the information inputted by the user. For example, the user may set the number of the channel, and a process of setting L of the filter of the present invention is performed by the channel setting section 600 in accordance with the number of the channel set by the user.

For instance, in case that the user sets eight channels, eight pass bands are required. Here, since four Multi images and Multi complementary images are needed respectively, the image number L for the Multi image and the Multi complementary image is set to be 4.

The gain setting section 602 sets gain about each of the pass bands (Multi image or complementary image) in accordance with input of the user. In case that normalized gain is used, gain range may be set from 0 to 1.

The frequency reconfiguration section 606 generates the response of each of the images in the digital filter described above, and generates responses of all Multi images and Multi complementary images corresponding to the channel set by the channel setting section 600. The responses of the Multi images and the Multi complementary images may be generated through the method shown in the Equations 13 and 14.

The equalizer section 608 generates final output of the equalizer using the gain of each of frequency bands set by the gain setting section 602 and the response of each of the Multi images and the Multi complementary image set in accordance with the channel in the frequency reconfigurable section 606. The output of the equalizer where the gain is adjusted may be expressed as following Equation 15.

$$h_{final}[n] = \sum_{L_1=0}^{\lfloor a/2 \rfloor} w_{L_1} \cdot hb_{(a),L_1}[n] + \sum_{L_2=1}^{\lfloor a/2 \rfloor} w_{L_2} \cdot hb^c_{(a),L_2}[n] \quad \text{[Equation 15]}$$

Although embodiments have been described with reference to a number of illustrative embodiments thereof, it should be understood that numerous other modifications and embodiments can be devised by those skilled in the art that will fall within the spirit and scope of the principles of this disclosure.

The invention claimed is:

1. A frequency reconfigurable digital filter comprising:
a Multi image response operation section configured to operate a response equation of a selected Multi image from a conversion response equation to convert a model filter response equation to generate Multi images which are repeatedly generated with a constant period in frequency domain; and
a Multi complementary image response operation section configured to operate a response equation of a selected Multi complementary image from a conversion response equation to convert a model filter response equation to generate Multi complimentary images which are repeatedly generated with a constant period in frequency domain, the Multi complementary images being generated without overlapping with the Multi images.

2. The frequency reconfigurable digital filter of claim 1, further comprising:
a filter response operation section configured to generate the response equation of the filter by summing response equations of each of the Multi images or Multi complementary images corresponding to selected bands when the selected bands correspond to plural Multi images or Multi complementary images.

3. The frequency reconfigurable digital filter of claim 1, wherein the conversion response equation for generating the Multi images is expressed as the following Equation, $$h_{(\alpha),L}[n] = \frac{1}{2\pi} \sum_{k=0}^{N-1} h[k] \int_{-\frac{(2L+1)\pi}{\alpha}}^{\frac{(2L+1)\pi}{\alpha}} e^{j(n-\alpha k)\omega'} d w'$$

$$= \sum_{k=0}^{N-1} h[k] \cdot \frac{1}{\alpha} K_{\alpha,L}(n, k),$$

here α is the sampling constant, h[n] is the response equation of the model filter, L is a Multi image number, $K_{\alpha,L}(n,k)$ is a sampling kernel scaled by a sampling constant, and the Multi image number corresponds to L.

4. The frequency reconfigurable digital filter of claim 1, wherein the conversion response equation for generating the Multi complementary images is expressed as the following Equation, $$h^c_{(\alpha),L}[n] = \frac{1}{2\pi} \sum_{k=0}^{N-1} h^c[k] \int_{-\frac{(2L)\pi}{\alpha}}^{\frac{(2L)\pi}{\alpha}} e^{j(n-\alpha k)\omega'} d w'$$

$$= \sum_{k=0}^{N-1} h^c[k] \cdot \frac{1}{\alpha} K^c_{\alpha,L}(n, k),$$

here α is a sampling constant, h[n] is the response equation of the model filter, L is a Multi image number, $K_{\alpha,L}(n,k)$ is a complementary sampling kernel scaled by a sampling constant, and the Multi image number corresponds to L.

5. The frequency reconfigurable digital filter of claim 1, wherein the Multi image response operation section operates a response equation of a selected Lth Multi image by subtracting a response equation for generating a (L−1) Multi image from a response equation for generating L Multi images.

6. The frequency reconfigurable digital filter of claim 1, wherein the Multi complementary image response operation section operates a response equation of a selected Lth Multi complementary image by subtracting a response equation for generating (L−1) Multi complementary images from a response equation for generating L Multi complementary images.

7. A frequency reconfigurable equalizer comprising:
a sampling kernel storage section configured to store a sampling kernel for performing upsampling of a model filter response equation scaled by a sampling constant and generating a response equation of Multi images which are repeatedly formed with a constant period;
a complementary conversion section configured to generate a response equation of Multi complementary images repeatedly generated with constant a period in frequency domain, the Multi complementary images being generated without overlapping with the Multi images and the Multi complimentary images having the same characteristic as the Multi images; and
an image response operation section configured to operate a response equation of images corresponding to a selected band among the Multi complementary images and the Multi images;
a gain setting section configured to set gain of the images; and
an equalizer section configured to generate a final output response equation by summing the response equations of the images to which the set gain is applied.

8. A frequency reconfigurable equalizer comprising:
a Multi image response operation section configured to operate a response equation of a selected Multi image from a conversion response equation to convert a model filter response equation to generate Multi images which are repeatedly generated with a constant period in frequency domain;
a Multi complementary image response operation section configured to operate a response equation of a selected Multi complementary image from a conversion response equation to convert a model filter response equation to generate Multi complimentary images which are repeatedly generated with a constant period in frequency domain, the Multi complementary images being generated without overlapping with the Multi images;
a gain setting section configured to set gain of images of which the response equations are operated in the Multi image response operation section or the Multi complementary image response operation section; and
an equalizer section configured to generate a final output response equation by summing the response equations of the images of which the gains are set by the gain setting section.

9. A frequency reconfigurable filtering method comprising:
operating a response equation of a selected Multi image from a conversion response equation to convert a model filter response equation to generate Multi images which are repeatedly generated with a constant period in frequency domain; and
operating a response equation of a selected Multi complementary image from a conversion response equation to convert a model filter response equation to generate Multi complimentary images which are repeatedly generated with a constant period in frequency domain, the Multi complementary images being generated without overlapping with the Multi images.

10. The frequency reconfigurable filtering method of claim 9, further comprising:
operating a response equation of the filter by summing response equations of each of the Multi image or the Multi complementary image corresponding to selected bands when the selected bands correspond to plural Multi images or Multi complementary images.

11. The frequency reconfigurable filtering method of claim 9, wherein the response equation for generating the Multi images is expressed as following Equation, $$h_{(\alpha),L}[n] = \frac{1}{2\pi} \sum_{k=0}^{N-1} h[k] \int_{-\frac{(2L+1)\pi}{\alpha}}^{\frac{(2L+1)\pi}{\alpha}} e^{j(n-\alpha k)\omega'} d w'$$

$$= \sum_{k=0}^{N-1} h[k] \cdot \frac{1}{\alpha} K_{\alpha,L}(n, k),$$

here α is the sampling constant, h[n] is the response equation of the model filter, L is a Multi image number, $K_{\alpha,L}(n,k)$ is a sampling kernel scaled by a sampling constant, and the Multi image number corresponds to L.

12. The frequency reconfigurable filtering method of claim 9, wherein the response equation for generating the Multi complementary image is expressed as following Equation, $$h^c_{(\alpha),L}[n] = \frac{1}{2\pi} \sum_{k=0}^{N-1} h^c[k] \int_{-\frac{(2L)\pi}{\alpha}}^{\frac{(2L)\pi}{\alpha}} e^{j(n-\alpha k)\omega'} d\omega'$$

$$= \sum_{k=0}^{N-1} h^c[k] \cdot \frac{1}{\alpha} K^c_{\alpha,L}(n,k),$$

here α is a sampling constant, h[n] rd is the response equation of the model filter, L is a Multi image number, $K_{\alpha,L}(n,k)$ is a complementary sampling kernel scaled by a sampling constant, and the Multi image number corresponds to L.

13. The frequency reconfigurable filtering method of claim 9, wherein when the Lth Multi image is selected, a response equation of the selected Lth Multi image is generated by subtracting a response equation for generating (L−1) Multi images from a response equation for generating L Multi images.

14. The frequency reconfigurable filtering method of claim 9, wherein when the Lth Multi complementary image is selected, a response equation of the selected Lth Multi complementary image is generated by subtracting a response equation for generating (L−1) Multi complementary images from a response equation for generating L Multi complementary images.

15. A method of designing a frequency reconfigurable equalizer, the method comprising:
   operating a response equation of Multi images which are formed repeatedly with a constant period in frequency domain, the response equation of the Multi images being operated by applying a sampling kernel scaled by a sampling constant;
   operating a response equation of Multi complementary images which are formed repeatedly with a constant period in frequency domain, the Multi complementary images being generated without overlapping with the Multi images, the Multi complimentary images having the same characteristic as the Multi images; and
   operating a response equation of an image corresponding to a selected band among the Multi complementary images and the Multi images;
   setting gain of the images of which response equations are operated; and
   operating a final output response equation by summing the response equations of the images to which the gain is set.

16. A method of designing a frequency reconfigurable equalizer, the method comprising:
   operating a response equation of a selected Multi image from a conversion response equation to convert a model filter response equation to generate Multi images which are repeatedly generated with a constant period in frequency domain;
   operating a response equation of a selected Multi complementary image from a conversion response equation to convert a model filter response equation to generate Multi complimentary images which are repeatedly generated with a constant period in frequency domain, the Multi complementary images being generated without overlapping with the Multi images;
   setting gain of the images of which the response equations are operated; and
   operating a final output response equation by summing the response of the images to which the gain is set.

* * * * *